US012618171B2

(12) United States Patent
Xu et al.

(10) Patent No.: US 12,618,171 B2
(45) Date of Patent: May 5, 2026

(54) LARGE DIAMETER SILICON CARBIDE SINGLE CRYSTALS AND APPARATUS AND METHOD OF MANUFACTURE THEREOF

(71) Applicant: II-VI ADVANCED MATERIALS, LLC, Pine Brook, NJ (US)

(72) Inventors: Xueping Xu, Wesport, CT (US); Ilya Zwieback, Township Of Washington, NJ (US); Avinash Gupta, Basking Ridge, NJ (US); Varatharajan Rengarajan, Flanders, NJ (US)

(73) Assignee: II-VI ADVANCED MATERIALS, LLC, Pine Brook, NJ (US)

( * ) Notice: Subject to any disclaimer, the term of this patent is extended or adjusted under 35 U.S.C. 154(b) by 0 days.

(21) Appl. No.: 18/415,291

(22) Filed: Jan. 17, 2024

(65) Prior Publication Data

US 2024/0150931 A1 May 9, 2024

Related U.S. Application Data

(60) Continuation of application No. 17/249,597, filed on Mar. 5, 2021, now Pat. No. 11,905,618, which is a
(Continued)

(51) Int. Cl.
*C30B 25/02* (2006.01)
*C01B 33/025* (2006.01)
(Continued)

(52) U.S. Cl.
CPC ............ *C30B 25/02* (2013.01); *C01B 33/025* (2013.01); *C30B 23/06* (2013.01); *C30B 29/36* (2013.01); *Y10T 117/00* (2015.01)

(58) Field of Classification Search
CPC ....... C01B 33/025; C30B 23/06; C30B 25/02; C30B 29/36; Y10T 117/00
See application file for complete search history.

(56) References Cited

U.S. PATENT DOCUMENTS 6,048,813 A * 4/2000 Hunter ................... C30B 29/36
501/86
6,451,112 B1 9/2002 Hara et al.
(Continued)

FOREIGN PATENT DOCUMENTS

JP 2011192817 A 9/2011
JP 2011219287 A 11/2011
JP 2013166657 A 8/2013

*Primary Examiner* — Hua Qi
(74) *Attorney, Agent, or Firm* — Blank Rome LLP

(57) ABSTRACT

In an apparatus and method growing a SiC single crystal, a PVT growth apparatus is provided with a single crystal SiC seed and a SiC source material positioned in spaced relation in a growth crucible. A resistance heater heats the growth crucible such that the SiC source material sublimates and is transported via a temperature gradient that forms in the growth crucible in response to the heater heating the growth crucible to the single crystal SiC seed where the sublimated SiC source material condenses forming a growing SiC single crystal. Purely axial heat fluxes passing through the bottom and the top of the growth crucible form a flat isotherm at least at a growth interface of the growing SiC single crystal on the single crystal SiC seed.

21 Claims, 11 Drawing Sheets

Related U.S. Application Data continuation of application No. 16/458,385, filed on Jul. 1, 2019, now Pat. No. 11,035,054, which is a division of application No. 15/584,583, filed on May 2, 2017, now abandoned.

(60) Provisional application No. 62/332,731, filed on May 6, 2016.

(51) Int. Cl.
C30B 23/06 (2006.01)
C30B 29/36 (2006.01)

(56) References Cited

U.S. PATENT DOCUMENTS

| | | | | |
|---|---|---|---|---|
| 6,670,282 B2 * | 12/2003 | Kuriyama | ............... | C30B 23/02 |
| | | | | 438/758 |
| 6,800,136 B2 | 10/2004 | Snyder et al. | | |
| 6,805,745 B2 | 10/2004 | Snyder et al. | | |
| 7,608,524 B2 | 10/2009 | Gupta et al. | | |
| 8,216,369 B2 | 7/2012 | Gupta et al. | | |
| 8,313,720 B2 | 11/2012 | Zwieback et al. | | |
| 8,741,413 B2 | 6/2014 | Zwieback et al. | | |
| 9,090,989 B2 | 7/2015 | Zwieback et al. | | |
| 9,228,274 B2 | 1/2016 | Rengarajan et al. | | |
| 2002/0083892 A1 * | 7/2002 | Kondo | .................... | C30B 23/00 |
| | | | | 117/109 |
| 2003/0037724 A1 * | 2/2003 | Snyder | .................... | C30B 29/36 |
| | | | | 117/208 |
| 2011/0217224 A1 * | 9/2011 | Nishiguchi | ............. | C30B 23/06 |
| | | | | 118/726 |
| 2012/0285370 A1 | 11/2012 | Gupta et al. | | |
| 2013/0269598 A1 * | 10/2013 | Chen | ........................ | C30B 23/06 |
| | | | | 117/86 |
| 2013/0280466 A1 | 10/2013 | Zwieback et al. | | |
| 2014/0360430 A1 * | 12/2014 | Armour | .................. | C30B 25/12 |
| | | | | 118/728 |
| 2016/0122902 A1 * | 5/2016 | Harada | ................... | C30B 29/36 |
| | | | | 117/109 |

* cited by examiner (EXAMPLE 1 GROWTH RUN)

(EXAMPLE 2 GROWTH RUN)

LARGE DIAMETER SILICON CARBIDE SINGLE CRYSTALS AND APPARATUS AND METHOD OF MANUFACTURE THEREOF

CROSS REFERENCE TO RELATED APPLICATIONS

This application is a continuation of U.S. patent application Ser. No. 17/249,597, filed Mar. 5, 2021, which is a divisional of U.S. patent application Ser. No. 16/458,385, filed Jul. 1, 2019, now U.S. Pat. No. 11,035,054, which is a divisional of U.S. patent application Ser. No. 15/584,583, filed on May 2, 2017, which claims the benefit of U.S. Provisional Patent Application No. 62/332,731, filed on May 6, 2016, the disclosures of each of which are incorporated herein by reference in their entireties.

BACKGROUND

Field of the Invention

Disclosed herein is high-quality, large-diameter silicon carbide (SiC) single crystals, and an apparatus and method of growth thereof.

Description of Related Art

SiC single crystals find their use in a variety of semiconductor, electronic, and optoelectronic devices where SiC wafers serve as substrates for the growth of epitaxial layers of SiC or GaN. The epilayers are then fabricated into devices, such as power switching devices, RF/microwave devices and LEDs. Compared to traditional Si-based devices, SiC-based and GaN-based devices can operate at much higher temperature, power level, frequency—all combined with improved efficiency.

Wide-spread application of SiC-based and GaN-based devices is hampered by the high cost the SiC substrate, which is a major contributor to the overall device cost. Currently, the largest 4H-SiC and 6H-SiC substrates available commercially are of 100 mm and 150 mm in diameter, while development of 200 mm SiC substrates has been announced. Implementation of large-size SiC substrates, such as of 200 mm, 250 mm or 300 mm in diameter in the device technology can substantially reduce the cost of SiC- and GaN-based devices.

Crystal defects in the SiC substrate are harmful to the device performance, especially in the SiC-based power switching devices formed on N-type 4H-SiC substrates. It is known that threading dislocations cause charge leakage and device degradation, while basal plane dislocations and stacking faults can cause terminal device failure. Stress and strain in the SiC substrate are negative factors in device processing.

Industrial-size SiC single crystals, e.g., 100 mm and 150 mm in diameter, are grown by the technique of Physical Vapor Transport (PVT). A sectional view of a conventional PVT growth apparatus is shown schematically in FIG. 1, wherein a graphite growth crucible 1 charged with a SiC source material 2 and a single crystal SiC seed 3 in spaced relation is placed in a growth chamber 20. A heating means 4, for heating the interior of crucible 1 to a sublimation growth temperature, e.g., between 2000° C. and 2400° C., can be provided about the exterior of chamber 20, which can be water-cooled and formed from fused silica. In this example, heating means 4 can be an exterior RF heating coil. However, heating means in the form of a resistance heater inside chamber 20 is envisioned. For the purpose of this description, heating means 4 will be described as being an RF heating coil. However, this is not to be construed in a limiting sense.

Crucible 1 is surrounded by thermal insulation 5 inside of chamber 20. A top window 5a having a relatively small diameter is provided in thermal insulation 5. This window 5a is provided for heat dissipation from the backside of SiC seed 3 attached to a top or lid 22 of growth crucible 1. Window 5a can also serve for measuring the temperature of the crucible top using an optical pyrometer via a sealed viewing port 30 in top or lid 22 of chamber 20.

In preparation for growth of a SiC single crystal 6 on SiC seed 3, chamber 20 and, hence, growth crucible 1 are evacuated via a vacuum pump and are filled to a desired pressure with a suitable process gas or gases, e.g., argon, nitrogen, boron, supplied through an inlet 36. By controlling the flow of process gas introduced into chamber 20 and, hence, growth crucible 1, via gas inlet 36, and controlling the operation of a vacuum pump connected to an outlet 38 of chamber 20, the gas pressure inside of chamber 20 and, hence, growth crucible 1, can be controlled to a pressure suitable for growth of SiC single crystal 6 on single crystal SiC seed 3. In an example, this pressure can be between 5 and 300 Torr. A window 5b can be provided in thermal insulation adjacent a bottom of growth crucible 1 for temperature measurement of crucible 1 using an optical pyrometer via a sealed viewing port 30 in a bottom 24 of crucible 20.

In use, crucible 1 is heated by heating means 4 to a temperature between 2000° C. and 2400° C. sufficient to vaporize the SiC source material 2 and fill the crucible material with vapor species 7 of $SiC_2$, $Si_2C$ and Si in the presence of a suitable pressure of the process gas within chamber 20 and, hence, growth crucible 1. Because growth crucible 1 is formed of porous graphite, process gas introduced into chamber 20 appears almost immediately in the interior of growth crucible 1. Similarly, a vacuum applied to chamber 20 appears almost immediately in the interior of growth crucible 1.

An axial temperature gradient is introduced in crucible 1 by properly positioning heating means 4 with respect to crucible 1 such that the temperature of SiC source material 2 is higher than that of SiC seed 3. In an example, this temperature gradient can be between 30° C. and 150° C. However, this is not to be construed in a limiting sense. Driven by this temperature gradient, the vapor species 7 migrate toward SiC seed 3, as illustrated schematically by arrow 7, and condense on SiC seed 3 causing growth of a SiC single crystal 6 on SiC seed 3.

The pattern of heat transport in the PVT growth apparatus is shown schematically in FIG. 1 by arrows 8 and 9. The heat absorbed by crucible 1 from heating means 4 is transported into the crucible interior by horizontal heat fluxes 8. Heat escapes crucible 1 via the top of crucible 1 and top window 5a in the form of vertical heat flux 9. As a result of such a heat transport pattern, curved isotherms 10 emerge in the crucible 1 and in the growing SiC single crystal 6.

Two features of the growth process, which are not independent, are critical to the quality of PVT-grown SiC crystals: (i) the shape of growth interface of the SiC single crystal 6 on the SiC seed 3 and (ii) the magnitude of radial temperature gradient(s) in the growing SiC single crystal 6. It is known that the growth interface follows the isotherm shape. A strongly curved growth interface leads to stacking faults, foreign polytypes, and other defects. The presence of a steep radial temperature gradient in the growing SiC single crystal 6 causes stress, strain, and related defects, such as basal plane dislocations. It is recognized that the most favorable for crystal quality is a flat growth interface, especially in the case of large-diameter SiC crystal growth.

U.S. Pat. No. 6,800,136 discloses a PVT growth apparatus and method, wherein harmful radial gradients in SiC sublimation growth can be reduced. The apparatus utilizes two flat heaters disposed below and above the exterior of the crucible. Disadvantages of this arrangement include: (i) in the case of RF heating, poor coupling of the flat RF coils to the crucible; and (ii) in the case of resistive heating, concave radial temperature gradients in the growing crystal lead to a concave growth interface. U.S. Pat. No. 6,800,136 is incorporated herein by reference.

U.S. Pat. No. 8,741,413 discloses a SiC sublimation growth apparatus and method, wherein the flux of SiC bearing vapors is restricted to the central area of the growing crystal. SiC boules grown using this arrangement suffer from the growth interface being too convex. U.S. Pat. No. 8,741,413 is incorporated herein by reference.

U.S. Pat. No. 9,228,274 discloses another SiC sublimation growth apparatus and method, wherein the heating arrangement includes a growth crucible positioned between two resistive heaters, a top heater and a bottom heater. The heaters are disposed coaxially with the crucible: the top, ring-shaped heater is disposed above the crucible, while the bottom, cup-shaped heater is disposed below and around the crucible. This arrangement has the following disadvantage: during growth, the SiC source vaporizes predominantly from the hotter areas located at the crucible walls, thus supplying the vapor mostly to the periphery of the growing SiC crystal. This leads to a concave growth interface, especially when the boule diameter is large. U.S. Pat. No. 9,228,274 is incorporated herein by reference.

In order to grow a large-diameter SiC single crystal, a large-diameter SiC seed wafer is needed. Large-diameter SiC seeds can be produced in a process commonly called "diameter expansion". US 2012/0285370 and U.S. Pat. No. 8,313,720 disclose SiC sublimation growth combined with expansion of boule diameter using a growth guide. During growth, the boule shape and the rate of diameter expansion are determined by the growth guide geometry. US 2012/0285370 and U.S. Pat. No. 8,313,720 are incorporated herein by reference.

Alternatively, a large size seed can be produced by intergrowth of smaller-size, tiled seed crystals, as disclosed in U.S. Pat. No. 6,805,745, which is incorporated herein by reference.

SUMMARY OF THE INVENTION

Disclosed herein is a growth apparatus that produces near-zero radial temperature gradients and a flat growth interface in the growing SiC boule, yielding high-quality SiC single crystals suitable for the fabrication of high-quality SiC substrates or wafers of standard diameters of 200 mm, 250 mm, and 300 mm.

Disclosed herein are large-diameter, high crystal quality SiC single crystal boules of 4H and 6H polytype grown by sublimation, and large-diameter, high-quality SiC single crystal substrates, N-type and semi-insulating fabricated from said boules, including substrates of standard diameters of 200 mm, 250 mm, and 300 mms.

Also disclosed is a method of growing large-diameter SiC single crystal boules of 4H and 6H polytype by sublimation, said boules suitable for the fabrication of high crystal quality SiC substrates having standard diameters of 200 mm, 250 mm, and 300 mm.

DESCRIPTION OF THE INVENTION

Various non-limiting examples will now be described with reference to the accompanying figures where like reference numbers correspond to like or functionally equivalent elements.

Figure 2:
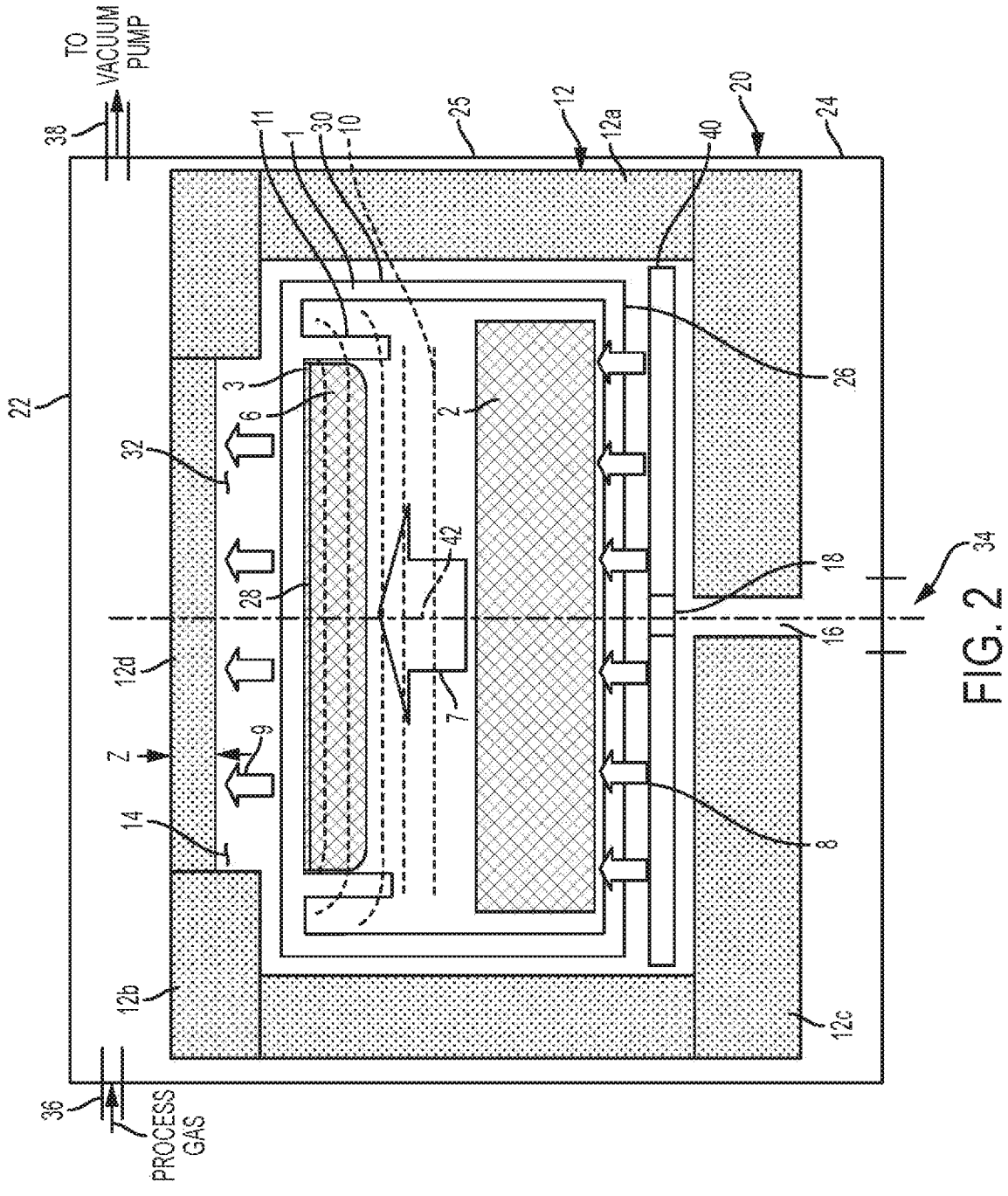
FIG. 2 is a sectional view of an example large-diameter PVT growth apparatus in accordance with the principles described herein.

A sectional view of an example large-diameter PVT growth apparatus for the growth of large-diameter SiC single crystals is shown schematically in FIG. 2. The PVT growth apparatus of FIG. 2 includes a graphite growth crucible 1, thermal insulation 12 (including cylindrical side insulation 12*a*, top insulation 12*b*, and bottom insulation 12*c*) and a heating means in the form of a single flat resistive heater 40 positioned between a bottom 26 of growth crucible 1 and bottom insulation 12*c*. In an example, thermal insulation 5 can be made of lightweight fiberous graphite, such as graphite felt or foam. In an example, chamber 20 can be optionally water-cooled. In this example, because resistive heater 40 is in the form of a flat-resistive heater positioned in the interior of chamber 20 between bottom 26 of growth crucible 1 and the bottom of insulation 5, chamber 20 can be formed of any suitable and/or desirable material capable of withstanding the heat produced by resistive heater 40 during growth of growing SiC single crystal 6 on single crystal SiC seed 3. In an example, chamber 20 can be formed of fused silica or a suitable metal or a metal alloy, such as stainless steel. However, this is not to be construed in a limiting sense since it is envisioned that chamber 20 can be formed of any suitable and/or desirable material.

In an example, resistive heater 40 can be made of dense graphite. The graphite can be iso-molded or extruded. Resistive heater 40 can be shaped as a flat disc and can be positioned under growth crucible 1 as shown in FIG. 2.

Figures 3A, 3B, 3C, 3D:
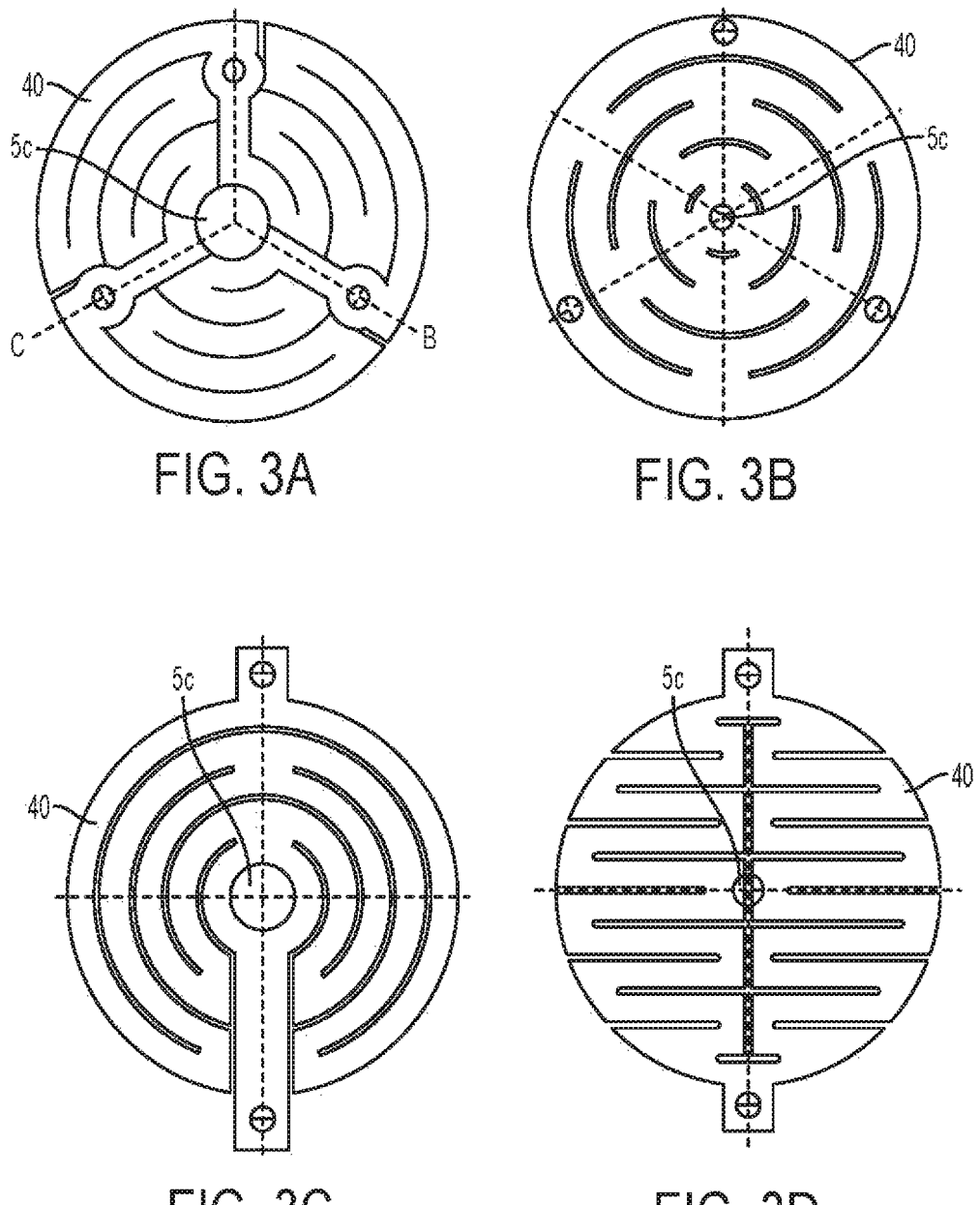
FIGS. 3A-3D are examples of the heating means (e.g., resistive heaters) that can be used in the example PVT growth apparatus shown in FIG. 2, wherein each heating means has a different conductive pattern for connection to delta and star three-phase electrical power (FIGS. 3A-3B) and single-phase electrical power (FIGS. 3C-3D)
Figures 4A, 4B, 4C, 4D, 4E:
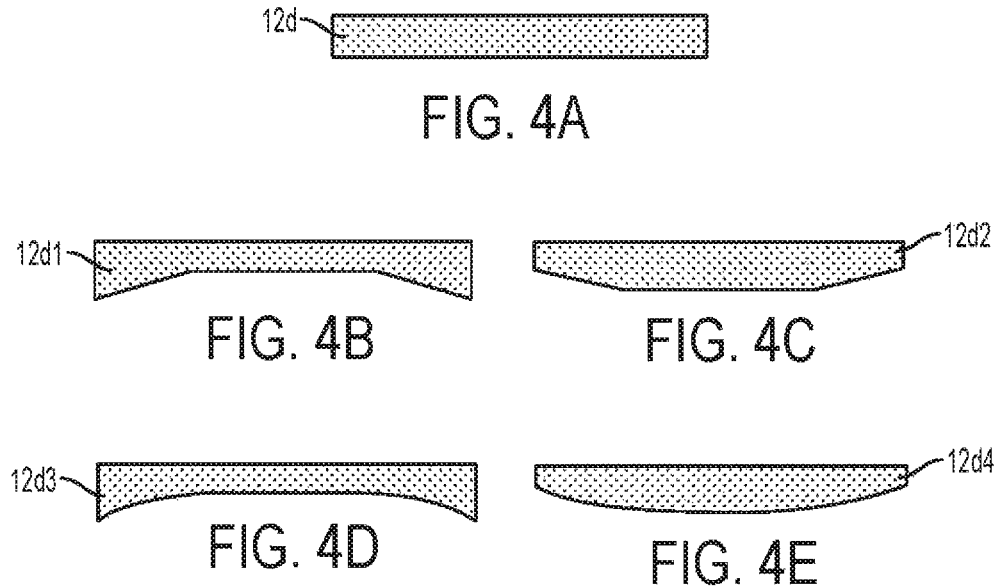
FIGS. 4A-4E are different configuration insulation inserts that can be used with the PVT growth apparatus shown in FIG. 2.

Referring to FIGS. 3A-3D, electric configurations of resistive heater 40 can include three-phase "Delta" (FIG. 3A), three phase "Star" (FIG. 3B), or single phase (FIGS. 3C-3D). The patterns of resistive heaters 40 shown in FIGS. 3A-3D are not to be construed in a limiting sense.

In preparation for growth, growth crucible 1, charged with SiC source material 2 and a single crystal SiC seed 3 in spaced relation, can be placed in a growth chamber 20, wherein the resistive heater 40 can be disposed below the crucible bottom 26, as shown in FIG. 2. Growth crucible 1 can be positioned inside chamber 20 which can be optionally water-cooled and optionally made from fused silica, a metal, or a metal alloy. However, this is not to be construed in a limiting sense.

Thermal insulation 12 can surround crucible 1 and can be positioned between crucible 1 and chamber 20. In contrast to the PVT growth apparatus of FIG. 1, the top window 5a in the insulation 5 in FIG. 1 can be replaced in FIG. 2 with a thermal insulation insert 12d positioned in an opening 14 of thermal insulation 12b that extends across at least a portion of the exterior top of crucible 1, whereupon the thermal insulation above the top or lid of growth crucible 1 includes top insulation 12b and thermal insulation insert 12d. The thickness and shape of insulation insert 12d are discussed below.

Small-diameter windows 16 and 18 can be provided in the bottom insulation piece 12c and in heater 40, respectively. These windows serve for temperature measurement, via an optical pyrometer, via a sealed viewing port 34 in the bottom 26 of crucible 1.

In use, crucible 1 can be heated by resistive heater 40 to SiC sublimation temperature, e.g., between 2000° C. and 2400° C., to vaporize SiC source material 2 and fill the crucible 1 with C and Si-bearing vapor species 7 in the presence of a suitable gas pressure within chamber 20 and, hence, within growth crucible 1. Driven by an axial temperature gradient formed within growth crucible 1 by resistive heater 40, these vapor species 7 migrate toward single crystal SiC seed 3 and condense on single crystal SiC seed 3 causing growth of a SiC single crystal 6 on single crystal SiC seed 3.

Figure 1:
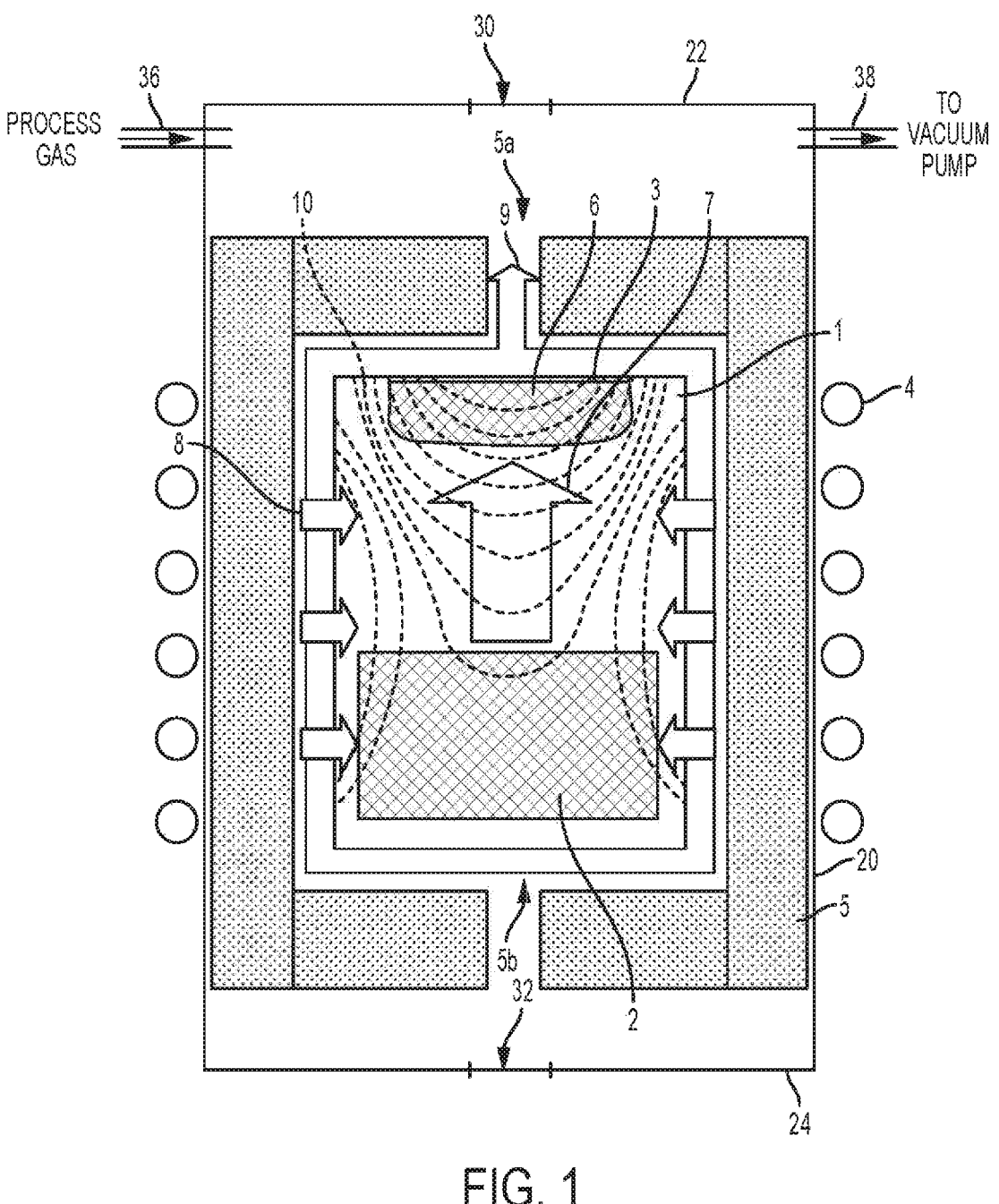
FIG. 1 is a sectional view of a conventional view (prior art) example PVT growth apparatus.

The pattern of heat transport in PVT growth apparatus shown in FIG. 2 differs from that of the example PVT growth apparatus shown in FIG. 1. Heat transport in the PVT growth apparatus of FIG. 2 is vertical, as shown schematically by arrows 8 and 9 in FIG. 2. Heat from resistive heater 40, which is disposed below the bottom 26 of growth crucible 1, is transported into the interior of crucible 1 by the axial heat fluxes shown by arrows 8. Heat escapes from a top or lid 22 of growth crucible 1 in the form of the axial heat fluxes shown by arrows 9, which diffuse across thermal insulation insert 12d. As a result of such purely axial heat fluxes, flat isotherms 10 emerge in the interior of growth crucible 1 and in the growing SiC single crystal 6.

Insulation insert 12d can be made of fibrous graphite insulation board. A value for the thickness t of insulation insert 12d can be determined from SiC growth experiments. However, an approximate value of t (in mm) can be calculated using the following equation:

$$t = \lambda \frac{\Delta T \cdot A}{Q} \qquad \text{(Eq. 1)}$$

In Eq. 1. $\lambda$ is the thermal conductivity of the insulation insert 12d (W/mK), $\Delta T$ is the temperature difference across the insulation insert 12d (° K), A is the area (m$^2$) of the insulation insert 12d, and Q is the heat flux across the insulation insert 12d (kW). Assuming $\lambda \approx 0.5$ W/mK, $\Delta T \approx 2000°$ K, $Q \approx 0.5$ kW and A=0.02 m$^2$, Eq. 1 yields the insert thickness t≈40 mm.

Example dimensions of the flat, disc-shaped insulation insert 12d can include: thickness desirably between 20 and 50 mm, or more desirably between 25 and 45 mm; and diameter between 90% and 120% of the diameter of the single crystal SiC seed 3.

Isotherms 10 and radial temperature gradients in growth crucible 1 can be further controlled by using non-flat, shaped insulation inserts 12d1-12d4. Example configurations of insulation inserts 12d-12d4 are shown in FIGS. 4A-4E. In an example, insulation insert 12d (FIG. 4A) can be a flat insert with parallel top and bottom surfaces. Insulation inserts 12d1 and 12d2 (FIGS. 4B-4C) can have planar top surfaces and bottom surfaces (which, in use, faces growth crucible 1) with sloped edges. Insulation inserts 12d3 and 12d4 can have planar top surfaces and bottom surfaces (which, in use, faces growth crucible 1) with rounded edges. Inserts 12d1 and 12d3 (FIGS. 4B-4D) can have concave shapes. Inserts 12d2 and 12d4 (FIGS. 4C and 4E) can have convex shapes. Inserts 12d1 and 12d3 can have a flat central portion and the edge area concave or sloped towards growth crucible 1. These inserts 12d1 and 12d3 can be used when the growth interface of SiC single crystal 6 is concave and the crystal attaches to a growth guide 11 of crucible 1. Insulation inserts 12d2 and 12d4 can have a flat central portion and the edge area convex sloped away from growth crucible 1. These inserts 12d2 and 12d4 can be used when the growth interface of SiC single crystal 6 is convex.

In an example, the radius or curvature or the angle of slope of the concave (12d1 and 12d3) or convex (12d2 and 12d4) edge areas, and/or where the flat central portion of insulation insert(s) 12d1-12d4 ends and where said radius of curvature or slope begins can be selected or tuned as necessary to cause flat (or substantially flat) isotherms 10 to be present at the growth interface of growing SiC single crystal 6, inside of the growing SiC single crystal 6, and within growth crucible 1.

Also, the aspect ratio of the growth crucible 1, defined as a ratio of the outside diameter (OD) of crucible 1 to the height of crucible 1, can be greater than one, i.e., the crucible OD is larger than its height. It has been observed that increasing the crucible OD helps further reduce undesirable radial temperature gradients in the central areas of crucible 1. In an example, for 200 mm crystal growth, the aspect ratio of growth crucible 1 can desirably be between 1 and 3, or more desirably between 1.5 and 2.5. In another example, for 300 mm crystal growth, the aspect ratio of growth crucible 1 can desirably be between 1.5 and 4, or more desirably between 2 and 3.

To aid in forming flat (or substantially flat) isotherms within growth crucible 1, at least the interior facing surface of top or lid 22 of growth chamber 20 is colored black, whereupon said black coloring enables top 22 to absorb heat flux coming into contact therewith while avoiding or reducing reflection of said heat flux back into the interior of chamber 20. The interior surface of top 22 can be colored black in any suitable or desirable manner such as, for example, a high temperature black paint that is compatible with the material forming top or lid 22. However, this is not to be construed in a limiting sense.

By coloring its interior facing surface black, top or lid 22 of chamber 20 more closely approximates a black body (known in classical physics) that absorbs radiation that falls on its surface. Of course, an ideal black body that absorbs all radiation does not exist. However, by coloring at least the interior surface of top or lid 22 of chamber 20 black, or forming top 22 of a material that is black in color, the reflection of heat flux from top 22 back into chamber 20 can be reduced or avoided enabling at least some control of heat flux being reflected by the interior facing surface of top or lid 22 back into chamber 20. While not ideal, the black colored interior facing surface of top or lid 22 has been observed to be advantageous in the formation of flat (or substantially flat) isotherms 10 within growth crucible 1 and, more particularly, at the growth interface of growing SiC single crystal 6, and inside of the growing SiC single crystal 6.

Herein, a substantially flat isotherm (as determined by finite element analysis) is considered to be one that corresponds to a radial temperature variation in the growth crucible 1 of less than 10° C. between a central axis 42 of the growth crucible 1 and the outside diameter of the SiC single crystal 6 growing on SiC seed 3. However, this is not to be construed in a limiting sense.

By optimizing the radial gradients using the aforementioned approaches, large-diameter SiC crystal 6 boules having flat growth interfaces and low levels of stress can be grown.

Example 1. Run GQ0090: Growth of High Crystal Quality 200 mm Diameter N-Type 4H-SiC Boule For this growth run, a high quality 4H-SiC single crystal seed 3 wafer was prepared having a diameter of 225 mm and oriented 4 degrees off-axis. This single crystal SiC seed 3 wafer was sliced from a large-diameter 4H SiC boule produced by diameter expansion in accordance with the teaching of US 2012/0285370 and/or U.S. Pat. No. 8,313,720.

Figure 5:
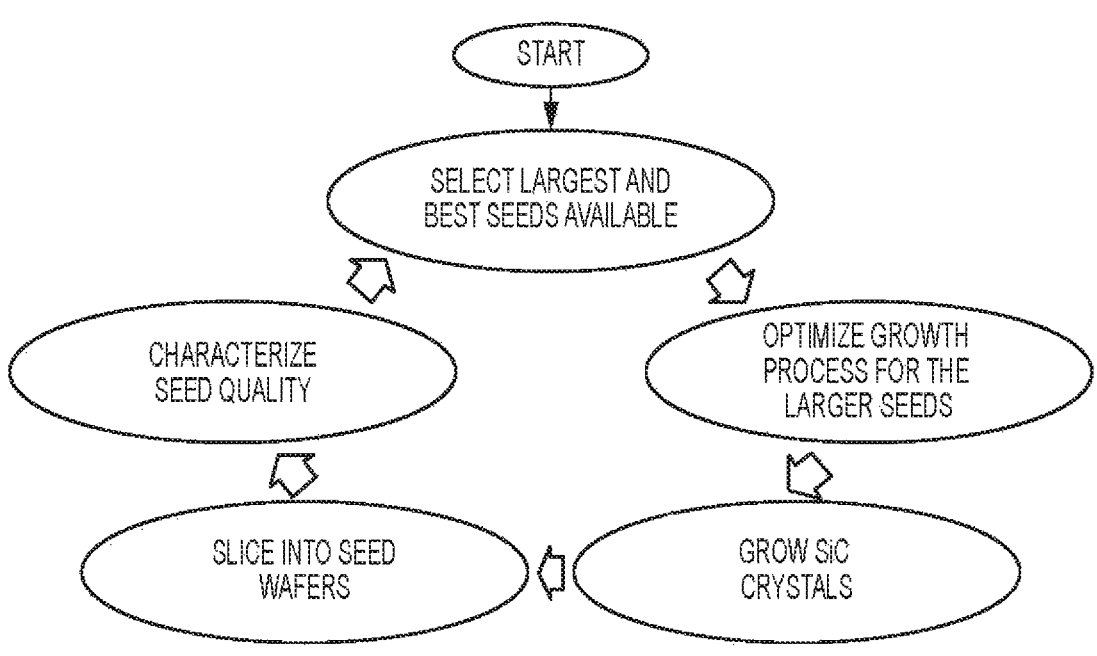
FIG. 5 is a flow diagram of a method for producing by diameter expansion a SiC single crystal boule from which a SiC single crystal wafer can be sliced and used as the single crystal SiC seed in the PVT growth apparatus of FIG. 2.

Expansion of the SiC boule diameter was accomplished through a number of sequential crystal growth runs, according to the flowchart shown in FIG. 5. Diameter expansion starts with selection of a quality single crystal SiC seed 3 of smaller diameter. This seed can be used in a PVT growth process tuned to produce defect-free or substantially defect-free diameter expansion. The thus grown SiC single crystal 6 boule can be sliced into wafers which are larger in diameter than the initial SiC seed 3. The wafers can be thoroughly characterized, and only best quality wafers can be used as seeds 3 in the next growth run (expansion round). As the SiC seed 3 diameter increases from one growth run (expansion round) to the next, the growth process in each run can be tuned, for example, to optimize SiC single crystal 6 growth for each round of expansion.

The PVT growth apparatus shown in FIG. 2 was used in the growth run of this Example 1. The graphite growth crucible 1 of this PVT growth apparatus had a 250 mm OD. The growth crucible 1 was loaded with SiC source grain material 2 disposed at the crucible bottom. The aforementioned 4H-SiC single crystal seed 3 wafer of 225 mm in diameter was disposed at the interior top or lid 22 of growth crucible 1. The three-phase flat serpentine heater 40 shown schematically in FIG. 3A was positioned under the bottom 26 of crucible 1.

In this run, a flat insulation insert 12d (shown in FIGS. 2 and 4A) was used. Insulation insert 12d was made of a rigid insulation board. The insulation insert 12d dimensions were 220 mm diameter and 25 mm thick. During this run, temperatures and pressures typical for the prior art PVT growth were used. In order to produce N-type material, gaseous nitrogen (versus argon) was added to the growth atmosphere as the process gas.

Figure 6:
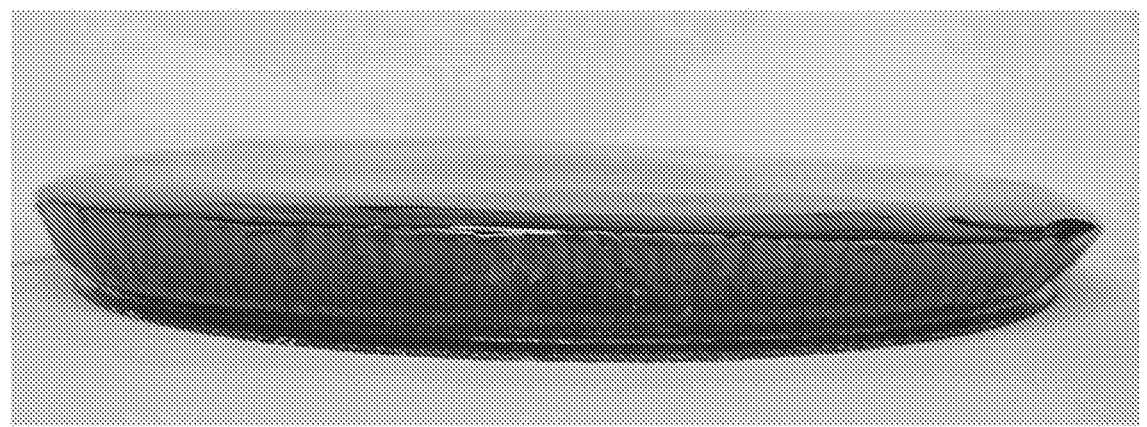
FIG. 6 is a photograph of an N-type 4H-SiC boule grown in accordance with Example 1 growth described herein.

The growth run of this Example 1 yielded the 4H-SiC boule shown in FIG. 6. The boule had a flat growth interface; accordingly, a small c-facet was visible at the very edge of the boule. The flat growth interface was the consequence of flat isotherms and a sign of low crystal stress.

Figure 7:
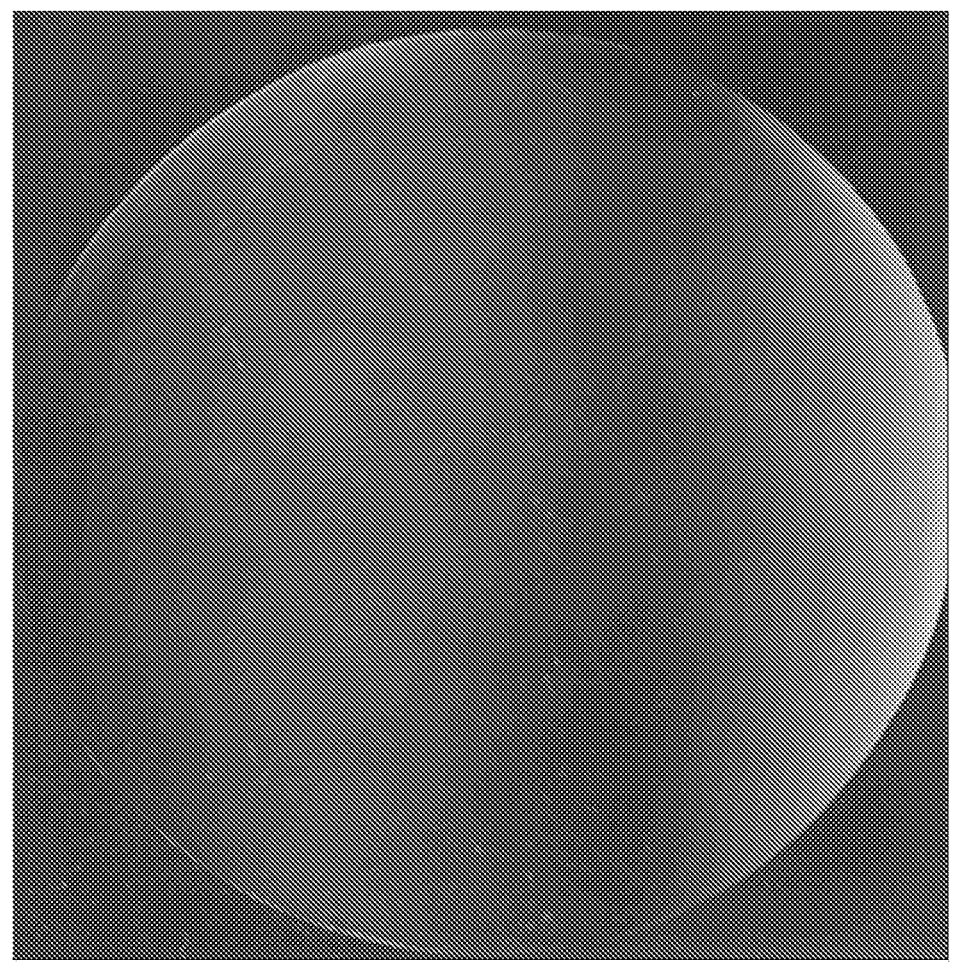
FIG. 7 is a cross-polarizer image of a wafer extracted from the boule shown in FIG. 6.

The as-grown boule of Example 1 was processed into 200 mm diameter wafers. A cross-polarizer image taken of one these wafers is shown in FIG. 7. The image shows neither local nor global crystal stress.

Figure 8A:
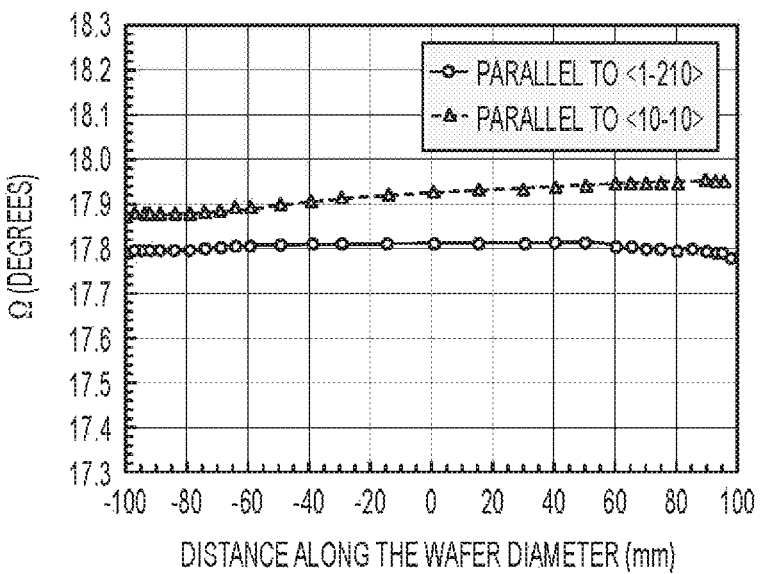
FIG. 8A is a graph of lattice curvature versus distance along the wafer diameter of the wafer shown in FIG. 7.
Figure 8B:
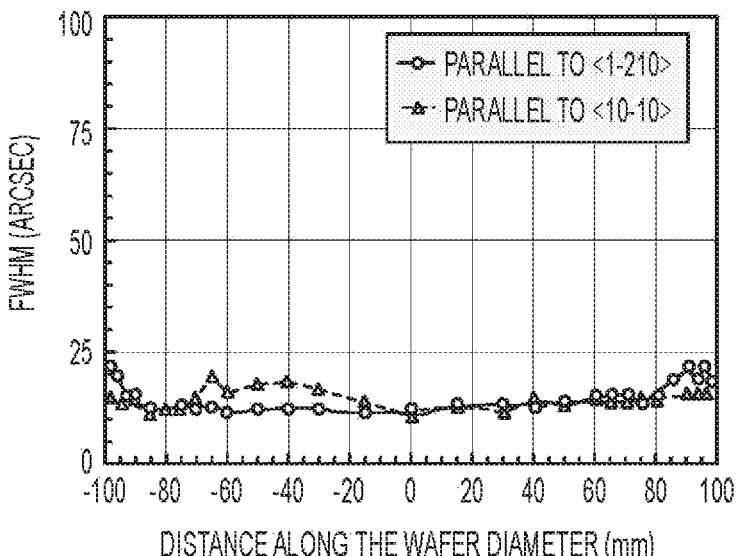
FIG. 8B is a graph of FWHM versus distance along the wafer diameter of the wafer shown in FIG. 7.

Wafers sliced from the as-grown boule of Example 1 were polished and characterized using X-ray rocking curves. The wafers were scanned in two orthogonal directions: parallel to the <1-210> crystallographic direction and parallel to the <10-10> direction. The results obtained from one of these wafers are shown in FIGS. 8A-8B. As can be seen, the lattice curvature (FIG. 8A) in this wafer is below 0.1°, while FWHM (FIG. 8B) across the entire wafer area does not exceed 25 arc-seconds. This testifies to the excellent crystal quality of this as-grown SiC wafer.

Figure 9:
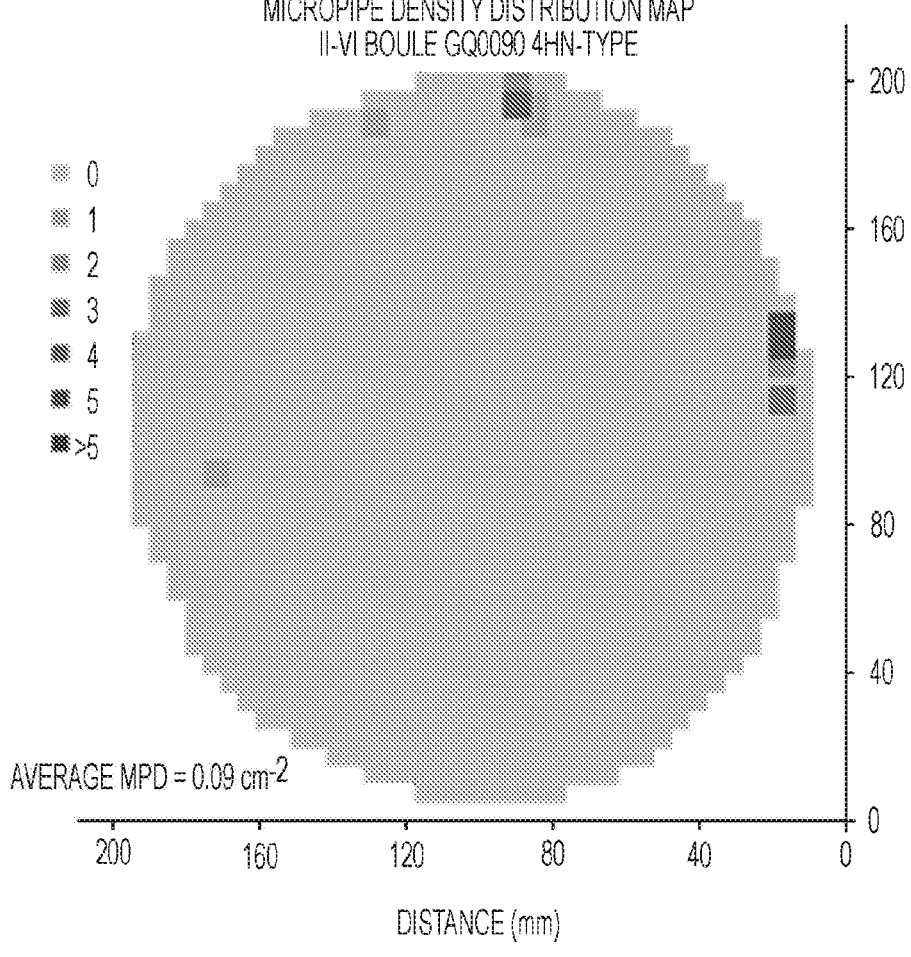
FIG. 9 is a micropipe density map of the wafer shown in FIG. 7.

FIG. 9 is a micropipe density map measured on one of the 200 mm wafers sliced from the 4H-SiC boule of Example 1. As can be seen, the wafer is practically micropipe free, with only a few micropipes visible near the wafer edge. The wafer-average micropipe density (MPD) in this wafer was measured to be 0.09 $cm^{-2}$, thus demonstrating very high crystal quality.

Figure 10A:
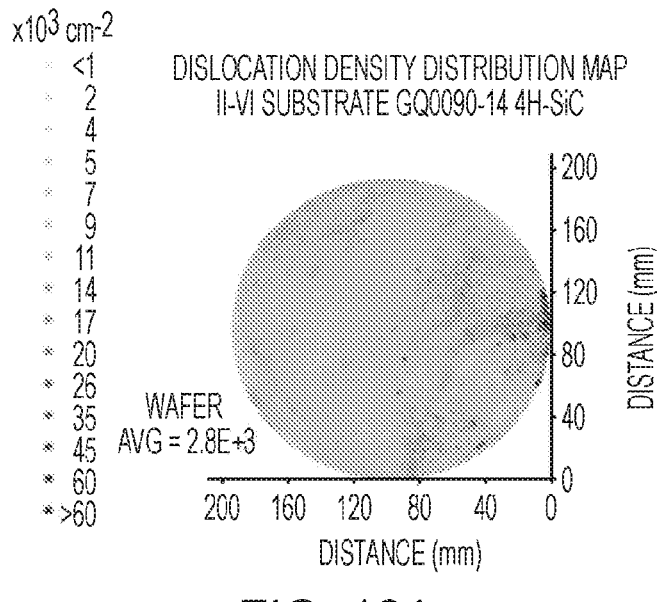
FIGS. 10A-10C are maps of overall dislocation density, screw dislocation density, and basal plane dislocation density, respectively, measured on the wafer shown in FIG. 7.
Figure 10B:
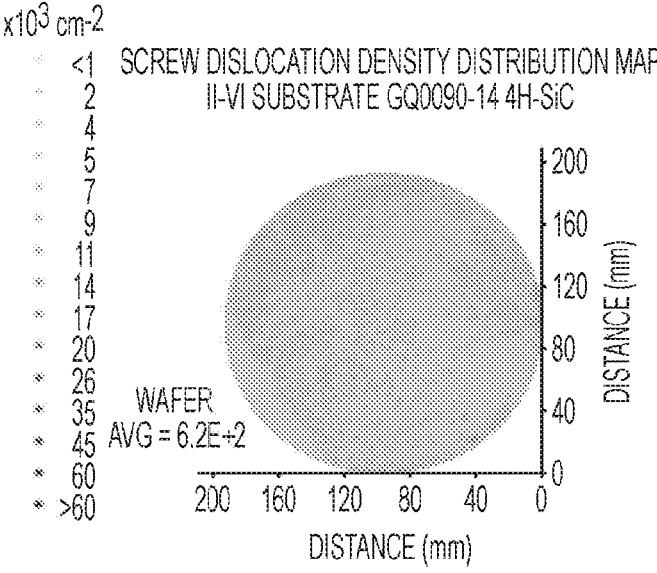
Figure 10C:
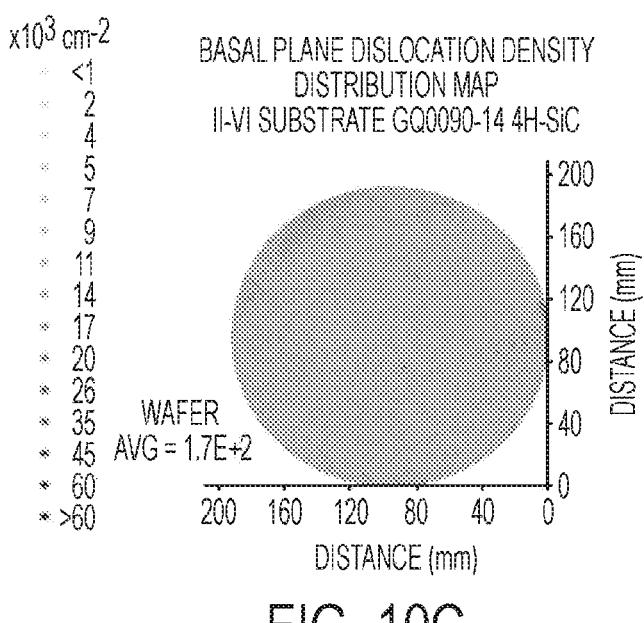

Dislocation density maps measured on one of the 200 mm wafers sliced from the 4H-SiC boule of Example 1 are shown in FIGS. 10A-10C. Dislocation etch pits were revealed by etching the wafer in molten KOH. The wafer had a total dislocation density of 2800 $cm^{-2}$ (FIG. 10A), threading screw dislocation (TSD) density of 620 $cm^{-2}$ (FIG. 10B), and basal plane dislocation (BPD) density of 170 $cm^{-2}$ (FIG. 10C). All these results point to excellent crystal quality.

Example 2. Run GP0105: Growth of High Crystal Quality 200 mm Diameter Vanadium-Doped Semi-Insulating 4H-SiC Boule For this growth run, a high quality 4H-SiC single crystal seed 3 wafer of 210 mm in diameter was prepared. This SiC seed 3 wafer was sliced from a larger diameter 4H-SiC boule grown by the process of diameter expansion discussed above. The SiC seed 3 wafer was sliced on-axis, that is, with its faces parallel to the basal (0001) plane.

Growth in this Example 2 was carried out in a PVT growth apparatus similar to that shown in FIG. 2. In order to produce a semi-insulating crystal, vanadium doping was employed combined with precise control over the presence of background impurities of nitrogen and boron. Vanadium compensation of silicon carbide was in accordance with the teachings of U.S. Pat. Nos. 7,608,524 and 8,216,369.

Figure 11:
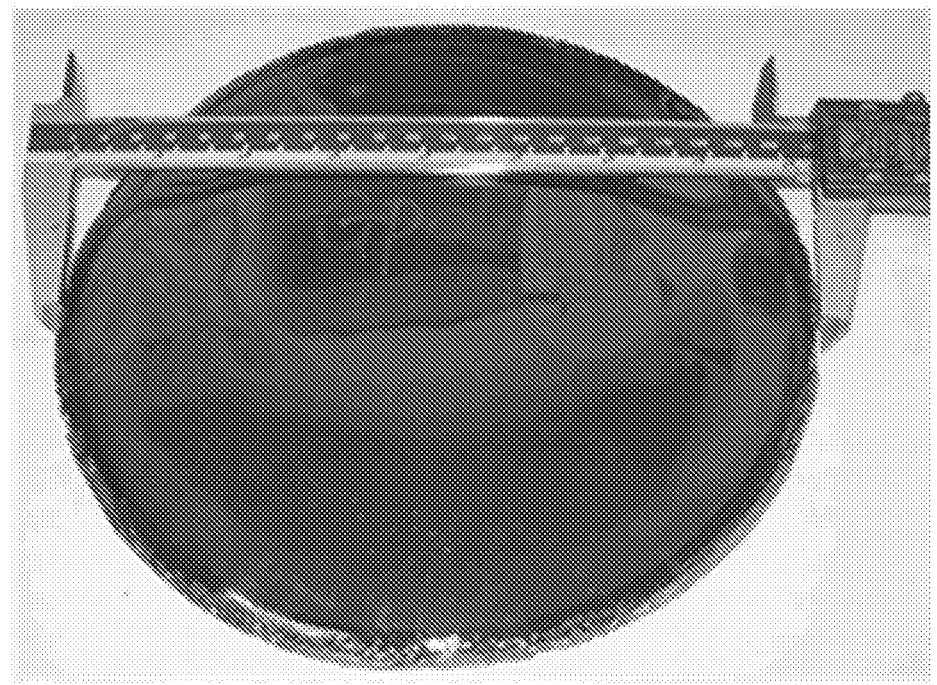
FIG. 11 is a photograph of a vanadium doped, semi-insulating 4H-SiC boule grown in accordance with Example 2 growth run described herein.

Growth in this Example 2 yielded a 4H-SiC boule of 209 mm in diameter shown in FIG. 11. The as-grown boule was fabricated into a plurality of 200 mm wafers, which were characterized. The characterization included evaluation of electrical properties and crystal quality. The results showed that the produced wafers were of Nu-type with their room-temperature resistivity above $1 \cdot 10^{12}$ Ohm-cm and the activation energy of resistivity of about 1 eV.

SIMS analysis performed on one of the wafers sliced from the boule of this Example 2 showed vanadium concentration of $1 \cdot 10^{17}$ atoms cm$^{-3}$, nitrogen at $6 \cdot 10^{15}$ atoms cm$^{-3}$, and boron at $3 \cdot 10^{5}$ atoms cm$^{-3}$.

Etching of a wafer sliced from the boule of this Example 2 in molten KOH revealed a wafer-averaged micropipe density of 0.1 cm$^{-2}$. Scanning of a polished wafer with X-ray rocking curves showed a lattice curvature of below 0.1° and a full width at half maximum (FWHM) of the X-ray reflection below 25 arc-seconds.

Various non-limiting examples of an apparatus and method described herein can include one or more or any combination of the features described in the following paragraphs.

As can be seen, disclosed herein is a PVT growth apparatus for PVT growing an SiC single crystal comprising growth chamber 20. Growth crucible 1 is positioned in the growth chamber 20. The growth crucible is configured to be charged with a SiC source material 2 at a bottom 26 of the growth crucible 1 and a single crystal SiC seed 3 at a top or lid 28 of the growth crucible 1 with the SiC source material and the single crystal SiC seed in spaced relation. Thermal insulation 12 surrounds the growth crucible 1 inside of the growth chamber 20. The thermal insulation 12 includes a side insulation piece 12a between a side 30 of the growth crucible 1 and a side 25 of the growth chamber 20, a bottom insulation piece 12c between the bottom 26 of the growth crucible 1 and a bottom 24 of the growth chamber 20, a top insulation piece 126 between the top 28 of the growth crucible 1 and a top 22 of the growth chamber 20. The thermal insulation 12 also includes an insulation insert 12d positioned in an opening 32 in the top insulation piece 12b. The insulation insert 12d has a thickness between 20 mm and 50 mm and a largest dimension between 90% and 120% of a largest dimension of the single crystal SiC seed 3. A geometry of the insulation insert can be tuned to control heat flux in the SiC single crystal that grows on the single crystal SiC seed in use of the PVT growth apparatus. A heater 40 is positioned between the bottom 26 of the growth crucible 1 and the bottom insulation piece 12c.

The side 30 of the growth crucible 1 have a cylindrical shape about a central axis 42.

In an example, at least an interior facing surface of the top 22 of the growth chamber 20 that faces the insulation insert 12d can be black in color. The growth chamber 20 is made from a metal or metal alloy, such as stainless steel.

In an example, at least the exterior facing surface of the top 22 of the growth chamber 20 that faces away from the insulation insert 12d can also be black in color.

In an example, a growth guide 11 can depend from the top 28 of the growth crucible 1 toward the bottom 26 of the growth crucible 1 and terminate above a top level of the SiC source material 2. The growth guide 11 can be spaced from an interior of the side 30 of the growth crucible 1.

In an example, the side, top, and bottom insulation pieces 12a. 12b, 12c can each have a thickness greater than or equal to the thickness of the insulation insert 12d. The side, top, and bottom insulation pieces 12a, 12b, and 12c can each have a thickness that is at least two times the thickness of the insulation insert 12d.

In an example, the heater 40 can comprise a flat resistance heater. The heater 40 can have a largest dimension greater than a largest dimension of the bottom 26 of the growth crucible 1.

In an example, desirably no part of the heater 40 resides in a space between the side 30 of the growth crucible 1 and the side 25 of the growth chamber 20 occupied by the side insulation piece 12a.

In an example, the heater 40 can reside exclusively between the bottom 26 of the growth crucible 1 and the bottom insulation piece 12c.

In an example, a ratio of an outside diameter of the growth crucible 1 over a height of the growth crucible 1 can be between 1 and 3 or between 1.5 and 4.

Also disclosed is a PVT growth apparatus for PVT growing an SiC single crystal comprising a growth crucible 1 having a side 30, a top 28, and a bottom 26, and an aspect ratio of an outside diameter over a height between 1 and 4. The top 28 of the growth crucible 1 is configured to support a single crystal SiC seed 3 in an interior of the growth crucible 1. Insulation 12 surrounds an exterior of the growth crucible 1. The insulation 12 includes side, top, and bottom insulation pieces 12a. 12b, 12c positioned adjacent the respective side, top, and bottom 30, 28, 26 of the growth crucible 1. The insulation 12 further includes an insulation insert 12d positioned in an opening 32 in the top insulation piece 12b. The insulation insert 12d has a thickness less than a thickness of any one or more of the side, top, and bottom insulation pieces 12a. 12b. 12c. A geometry of the insulation insert can be tuned to control heat flux in the SiC single crystal that grows on the single crystal SiC seed in use of the PVT growth apparatus. A heater 40 is positioned exclusively between a bottom 26 of the growth crucible 1 and the bottom insulation piece 12c.

In an example, the insulation insert 12d can have a thickness between 20 mm and 50 mm and a diameter between 90% and 120% of a diameter of a the single crystal SiC seed 3.

In an example, the PVT growth apparatus can further include a growth chamber 20 in which the growth crucible 1, insulation 12, and heater 40 are positioned. The growth chamber 20 can include a top 22 in spaced relation to the top 28 of the growth crucible 1. At least an interior facing surface of the top 22 of the growth chamber 20 can be black in color.

In an example, the PVT growth apparatus can further include at least one of the following: a window 5b in the bottom insulation piece 12c; and a window 5c in the heater 40.

Also disclosed herein is a method of PVT growing a SiC single crystal boule comprising providing the PVT growth apparatus described above with the single crystal SiC seed 3 and SiC source material 2 positioned in spaced relation in the growth crucible 1; and causing the heater 40 to heat the growth crucible 1 such that the SiC source material 2 sublimates and is transported via a temperature gradient that forms in the growth crucible 1 in response to the heater heating the growth crucible 1 to the single crystal SiC seed 3 where the sublimated SiC source material 2 condenses forming a growing SiC single crystal 6.

In an example, step (b) of the method can include purely axial heat fluxes 8, 9 passing through the bottom 26 and the top 28 of the growth crucible 1 forming a flat isotherm at least at a growth interface of the growing SiC single crystal 6 on the single crystal SiC seed 3.

In an example, it is envisioned that the growth apparatus and method described herein can be utilized to PVT grow a SiC single crystal boule having a first, outside diameter of at least 305 mm, e.g., between 205 mm and 305 mm; a thickness of at least 10 mm; and, within a second diameter of the SiC single crystal boule that is less than the first diameter, a total thickness variation of less than 20%, e.g., less than 10%. Herein, the total thickness variation is defined as the difference between maximum and minimum values of boule thickness within the second diameter divided by the average boule thickness.

In an example, the second diameter can be at least 5 mm less than the first diameter. Stated differently, the first diameter can be at least 5 mm more than the second diameter.

In an example, the SiC single crystal boule, and a wafer prepared (sliced) therefrom, can be a 4H or 6H polytype.

In an example, the SiC single crystal boule can be a nitrogen-doped N-type SiC single crystal boule.

In an example, the SiC single crystal boule can be vanadium-doped and semi-insulating.

In an example, a wafer having a diameter of 200 mm can be prepared (sliced) from a 205 mm SiC single crystal boule. In another example, a wafer having a diameter of 250 mm can be prepared (sliced) from a 255 mm SiC single crystal boule. In another example, a wafer having a diameter of 300 mm can be prepared (sliced) from a 305 mm SiC single crystal boule.

In an example, a 200 mm, 250 mm, or 300 mm diameter N-type 4H-SiC wafer can be prepared in accordance with the principles described herein and can have a wafer-average micropipe density of less than 0.1 $cm^{-2}$, e.g., less than 0.05 $cm^{-2}$; a wafer-average threading screw dislocation density of less than 1000 $cm^{-2}$, e.g., less than 300 $cm^{-2}$; and a wafer-average basal plane dislocation density of less than 500 $cm^{-2}$; e.g., less than 200 $cm^{-2}$.

In an example, a 200 mm, 250 mm, or 300 mm diameter n-type 4H-SiC wafer can be prepared in accordance with the principles described herein and can have a lattice curvature of less than 0.3°. e.g., less than 0.1°; and a full width at half maximum (FWHM) of a rocking curve of less than 25 arc-seconds, e.g., less than 15 arc-seconds.

In an example, a 200 mm, 250 mm, or 300 mm diameter N-type 4H-SiC wafer can be prepared in accordance with the principles described herein and can have total areas populated with stacking faults of less than 10%. e.g., less than 2% of the total wafer area.

In an example, a 200 mm diameter semi-insulating, vanadium doped SiC wafer can be prepared in accordance with the principles described herein and can have a micropipe density of less than 0.1 $cm^{-2}$; a lattice curvature of less than 0.3°, e.g., less than 0.1°; and a full width at half maximum (FWHM) of the rocking curve of less than 25 arc-seconds, e.g., less than 15 arc-seconds.

In an example, a 200 mm diameter semi-insulating, vanadium doped SiC wafer can be prepared in accordance with the principles described herein and can have a room temperature resistivity greater than $1 \cdot 10^{11}$ Ohm-cm.

In an example, a 200 mm diameter semi-insulating, vanadium doped. Nu-type 6H-SiC wafer can be prepared in accordance with the principles described herein and can have a room temperature resistivity greater than $1 \cdot 10^{11}$ Ohm-cm, or an activation energy of resistivity of at least 0.8 eV, or both In an example, a 200 mm diameter semi-insulating, vanadium doped, Pi-type 6H-SiC wafer can be prepared in accordance with the principles described herein and can have a room temperature resistivity greater than $1 \cdot 10^{12}$ Ohm-cm, or an activation energy of resistivity of at least 1.2 eV, or both.

In an example, a 200 mm diameter semi-insulating, vanadium doped, Nu-type 4H-SiC wafer can be prepared in accordance with the principles described herein and can have a room temperature resistivity greater than $1 - 10^{12}$ Ohm-cm; or an activation energy of resistivity of at least 1 eV, or both.

In an example, a 200 mm diameter semi-insulating, vanadium doped, Pi-type 4H-SiC wafer can be prepared in accordance with the principles described herein and can have a room temperature resistivity greater than $1 \cdot 10^{12}$ Ohm-cm; and an activation energy of resistivity of at least 1.5 eV, or both.

The foregoing examples have been described with reference to the accompanying figures. Modifications and alterations will occur to others upon reading and understanding the foregoing examples which are provided for the purpose of illustration and are not to be construed in a limiting sense. Accordingly, the foregoing examples are not to be construed as limiting the disclosure.

The invention claimed is:

1. A Physical Vapor Transport (PVT) growth apparatus for PVT growing a SiC single crystal comprising:
   a growth chamber;
   a growth crucible positioned in the growth chamber, the growth crucible configured to be charged with a SiC source material at a bottom of the growth crucible and a single crystal SiC seed at a top or lid of the growth crucible with the SiC source material and the single crystal SiC seed in spaced relation;
   a growth guide positioned on either side of the single crystal SiC seed and extending from the top of the growth crucible toward the bottom of the growth crucible, terminating above a top level of the SiC source material;
   thermal insulation surrounding the growth crucible inside of the growth chamber, the thermal insulation including a side insulation piece between a side of the growth crucible and a side of the growth chamber, a bottom insulation piece between the bottom of the growth crucible and a bottom of the growth chamber, a top insulation piece between the top of the growth crucible and a top of the growth chamber, and an insulation insert positioned in an opening in the top insulation piece; and
   a heater positioned between the bottom of the growth crucible and the bottom insulation piece,
   wherein a geometry of the insulation insert is tuned to control heat flux in the SiC single crystal that grows on the single crystal SiC seed in use of the PVT growth apparatus, and
   wherein the insulation insert includes a top surface and a bottom surface, and the bottom surface of the insulation insert includes a concave surface portion or a convex surface portion that is configured to support a growth interface of the SiC single crystal that is concave or convex.

2. The PVT growth apparatus of claim 1, wherein at least an interior facing surface of the top of the growth chamber that faces the insulation insert is black in color.

3. The PVT growth apparatus of claim 2, wherein the growth chamber is made from a metal or metal alloy.

4. The PVT growth apparatus of claim 2, wherein the growth chamber is made from stainless steel.

5. The PVT growth apparatus of claim 2, wherein the apparatus includes an exterior facing surface that faces away from the insulation insert, and wherein the exterior facing surface is black in color.

6. The PVT growth apparatus of claim 1, wherein the growth guide is spaced from an interior of the side of the growth crucible.

7. The PVT growth apparatus of claim 1, wherein the side, top, and bottom insulation pieces each have a thickness greater than or equal to the thickness of the insulation insert.

8. The PVT growth apparatus of claim 7, wherein the side, top, and bottom insulation pieces each have a thickness that is at least two times the thickness of the insulation insert.

9. The PVT growth apparatus of claim 1, wherein the heater comprises a resistance heater.

10. The PVT growth apparatus of claim 1, wherein the heater has a largest dimension greater than a largest dimension of the bottom of the growth crucible.

11. The PVT growth apparatus of claim 1, wherein the heater resides exclusively between the bottom of the growth crucible and the bottom insulation piece.

12. The PVT growth apparatus of claim 1, wherein a ratio of an outside diameter of the growth crucible over a height of the growth crucible is between 1 and 3.

13. The PVT growth apparatus of claim 1, wherein a ratio of an outside diameter of the growth crucible over a height of the growth crucible is between 1.5 and 4.

14. The PVT growth apparatus of claim 1, wherein the heater is a three-phase resistive heater.

15. The PVT growth apparatus of claim 1, wherein:

the top surface of the insulation insert includes a planar surface that extends along a first geometric plane; and the concave surface portion or the concave surface portion is an outer segment of the bottom surface, and the bottom surface of the insulation insert includes a central segment surrounded by the outer segment, and the central segment is a planar surface that extends along a second geometric plane that is parallel with the first geometric plane.

16. The PVT growth apparatus of claim 15, wherein the concave surface portion of the outer segment extends further away from the top surface than the central segment of the bottom surface.

17. The PVT growth apparatus of claim 1, wherein the insulation insert has a thickness between 20 mm and 50 mm and a diameter between 90% and 120% of a diameter of the single crystal SiC seed.

18. A PVT growth apparatus for PVT growing a SiC single crystal comprising:

a growth crucible having a side, a top, and a bottom, the top of the growth crucible configured to support a single crystal SiC seed in an interior of the growth crucible, and the bottom of the growth crucible configured to support a SiC source material;

a growth guide positioned on either side of the single crystal SiC seed and extending from the top of the growth crucible toward the bottom of the growth crucible, terminating above a top level of the SiC source material;

insulation surrounding an exterior of the growth crucible, said insulation including side, top, and bottom insulation pieces positioned adjacent the respective side, top, and bottom of the growth crucible, the insulation further including an insulation insert positioned in an opening in the top insulation piece, wherein the insulation insert has a thickness less than a thickness of any one of the side, top, and bottom insulation pieces; and a heater positioned between the bottom of the growth crucible and the bottom insulation piece, wherein a geometry of the insulation insert is tuned to control heat flux in the SiC single crystal that grows on the single crystal SiC seed in use of the PVT growth apparatus, and wherein the insulation insert includes a top surface and a bottom surface, and the bottom surface of the insulation insert includes a concave surface portion or a convex surface portion that aids in generating isotherms that have a radial temperature variation in the growth crucible of less than 10° C. between a central axis of the growth crucible and an outside diameter of the single crystal SiC growing on single crystal SiC seed.

19. The PVT growth apparatus of claim 18, further including a growth chamber in which the growth crucible, insulation, and heater are positioned, the growth chamber including a top in spaced relation to the top of the growth crucible, wherein at least an interior facing surface of the top of the growth chamber is black in color.

20. The PVT growth apparatus of claim 18, wherein the growth guide is spaced from an interior of the side of the growth crucible.

21. The PVT growth apparatus of claim 18, wherein:

the top surface of the insulation insert includes a planar surface that extends along a first geometric plane; and the concave surface portion or the concave surface portion is an outer segment of the bottom surface, and the bottom surface of the insulation insert includes a central segment surrounded by the outer segment, and the central segment is a planar surface that extends along a second geometric plane that is parallel with the first geometric plane.

*   *   *   *   *